(12) United States Patent
Fujishima

(10) Patent No.: US 11,362,606 B2
(45) Date of Patent: Jun. 14, 2022

(54) CONTROL DEVICE FOR ALTERNATING-CURRENT ELECTRIC MOTOR

(71) Applicant: DENSO CORPORATION, Kariya (JP)

(72) Inventor: Yuya Fujishima, Kariya (JP)

(73) Assignee: DENSO CORPORATION, Kariya (JP)

( * ) Notice: Subject to any disclaimer, the term of this patent is extended or adjusted under 35 U.S.C. 154(b) by 36 days.

(21) Appl. No.: 16/502,524

(22) Filed: Jul. 3, 2019

(65) Prior Publication Data

US 2019/0326837 A1 Oct. 24, 2019

Related U.S. Application Data

(63) Continuation of application No. PCT/JP2017/045505, filed on Dec. 19, 2017.

(30) Foreign Application Priority Data

Jan. 10, 2017 (JP) .............................. JP2017-001890

(51) Int. Cl.
*H02P 6/28* (2016.01)
*H02P 23/18* (2016.01)
(Continued)

(52) U.S. Cl.
CPC ............ *H02P 6/28* (2016.02); *G01R 19/0092* (2013.01); *G05B 1/06* (2013.01); *G05B 11/18* (2013.01);
(Continued)

(58) Field of Classification Search
USPC .......................................................... 318/71
See application file for complete search history.

(56) References Cited

U.S. PATENT DOCUMENTS 5,184,057 A * 2/1993 Sakai .................. H02M 5/4585
318/801
5,841,263 A 11/1998 Kaneko et al.
(Continued)

FOREIGN PATENT DOCUMENTS

JP 2008-182832 A 8/2008
JP 2008182832 A * 8/2008
(Continued)

OTHER PUBLICATIONS

Jan. 30, 2018 International Search Report issued in International Application No. PCT/JP2017/045505.

*Primary Examiner* — Jorge L Carrasquillo
(74) *Attorney, Agent, or Firm* — Oliff PLC

(57) ABSTRACT

An inverter converts direct-current power to alternating-current power by operations of a plurality of switching elements under a PWM control, and supplies the alternating-current power to an alternating-current electric motor. A feedback control computation unit of an inverter control unit uses current values acquired from current sensors detecting a current flowing to the alternating-current electric motor and a rotation angle of the alternating-current electric motor to perform a control computation in a (N/2) cycle (N is a natural number) of a triangular wave carrier of the PWM control. At the acquisition of the current values detected by the current sensors, an average acquisition unit acquires an average of current values in a carrier half cycle as a period between a peak and a valley of the carrier, or acquires a current value regarded as an average of the current values at an acquirable timing.

8 Claims, 21 Drawing Sheets

(51) Int. Cl.
  *G01R 19/00* (2006.01)
  *G05B 1/06* (2006.01)
  *G05B 11/18* (2006.01)
  *G05B 11/28* (2006.01)
  *H02P 27/08* (2006.01)

(52) U.S. Cl.
  CPC .............. *G05B 11/28* (2013.01); *H02P 23/18* (2016.02); *H02P 27/08* (2013.01)

(56) References Cited

U.S. PATENT DOCUMENTS

2010/0320948 A1* 12/2010 Royak .................... H03K 17/14
  318/400.13
2011/0062905 A1* 3/2011 Sakai .................... B62D 5/046
  318/400.05

FOREIGN PATENT DOCUMENTS

| JP | 2009077513 A | * | 4/2009 |
| JP | 2016-92989 A | | 5/2016 |
| JP | 2016092989 A | * | 5/2016 |

* cited by examiner

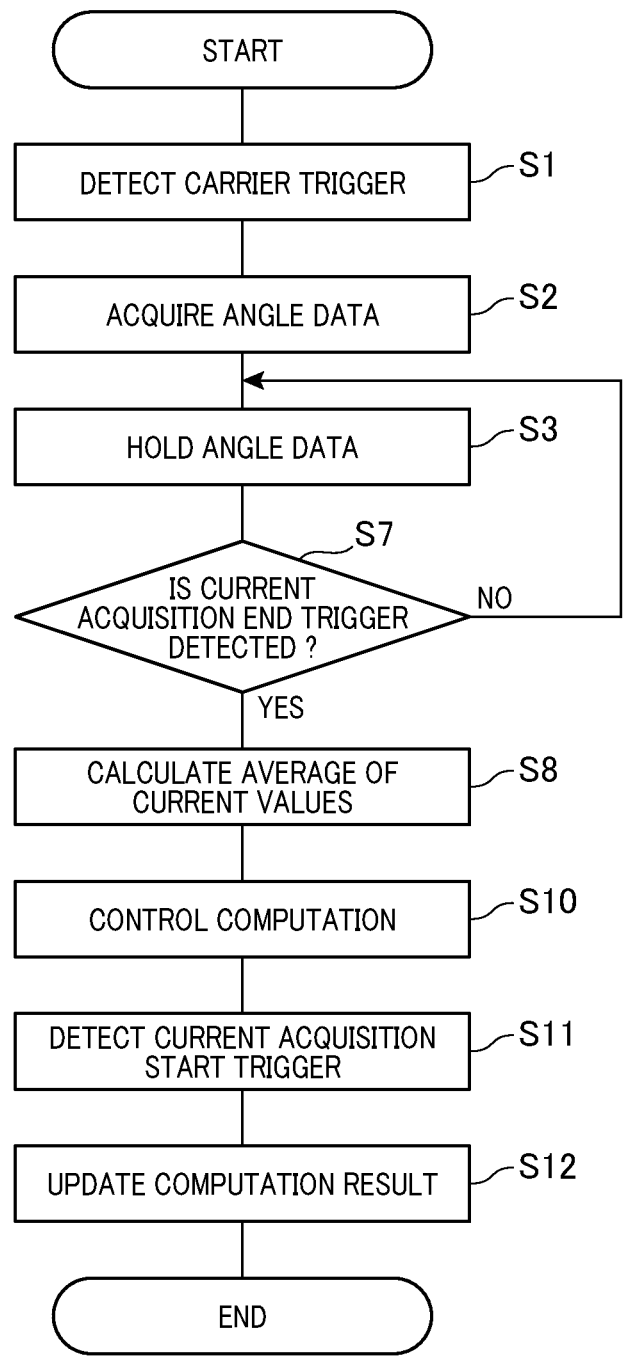

CONTROL DEVICE FOR ALTERNATING-CURRENT ELECTRIC MOTOR

CROSS-REFERENCE TO RELATED APPLICATION

This application is a U.S. application under 35 U.S.C. 111(a) and 363 that claims the benefit under 35 U.S.C. 120 from International Application No. PCT/JP2017/045505 filed on Dec. 19, 2017, the entire contents of which are incorporated herein by reference. This application is also based on and claims the benefit of priority from earlier Japanese Patent Application No. 2017-001890 filed on Jan. 10, 2017, the entire contents of which are incorporated herein by reference.

BACKGROUND

Technical Field

The present invention relates to a control device for an alternating-current electric motor.

Background Art

There has been known a motor control device that corrects the angle of dq coordinate axes by a phase (θc) corresponding to a delay time of a current sensor to equalize the phase angle of the actual dq-axis currents and the phase angle of the dq-axis currents in a control system.

SUMMARY

The control device for an alternating-current electric motor according to the present disclosure includes an inverter, a feedback control computation unit, and an average acquisition unit. The inverter converts direct-current power to alternating-current power, and supplies the alternating-current power to the alternating-current electric motor.

At the acquisition of a current value detected by a current sensor, the average acquisition unit acquires an average of the current values in a carrier half cycle as a period between a peak and a valley of the carrier, or acquires a current value regarded as an average of the current values at an acquirable timing.

BRIEF DESCRIPTION OF THE DRAWINGS

The foregoing and other objects, features, and advantages of the present disclosure will be more clarified by the following detailed descriptions with reference to the accompanying drawings. The drawings are as follows:

FIG. 20 is a flow chart of the average calculation process according to the fifth embodiment.

DETAILED DESCRIPTION OF THE PREFERRED EMBODIMENTS

Figure 1:
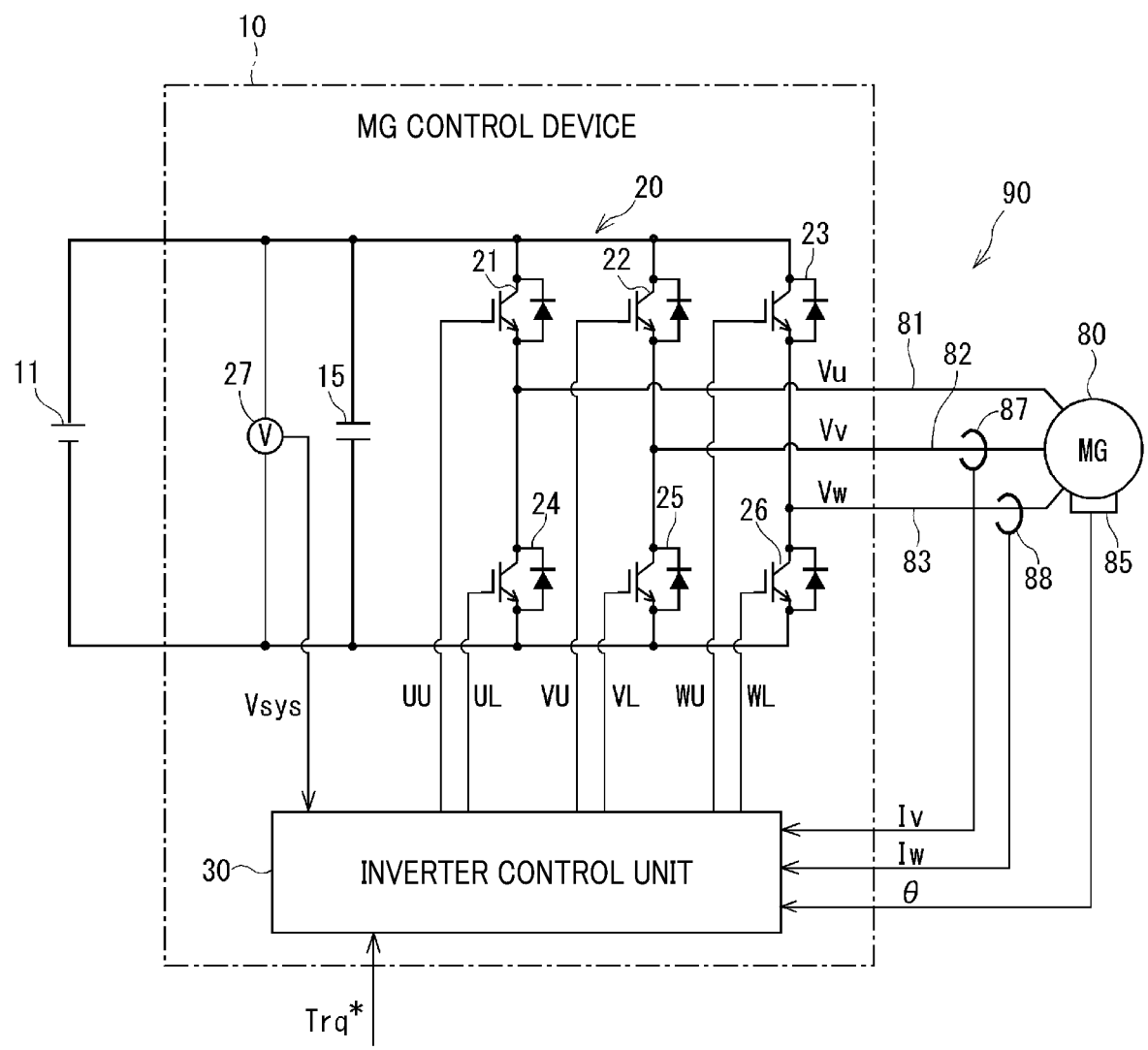
FIG. 1 is a schematic configuration diagram of an MG drive system to which a control device for an alternating-current electric motor according to each embodiment is applied.

The inventor of the present disclosure has studied a control device for an alternating-current electric motor that, under a PWM control, decreases an error in an acquired current value due to delayed detection by a current sensor and improves the accuracy of control computations.

In a PWM control of an inverter, the switching elements of upper and lower arms alternately turn on over peak or valley timings of a triangular wave carrier. A phase current increases in the on period of the upper arm element and decreases in the on period of the lower arm element, which results in a current ripple. The current detected by a current sensor is sampled at peak or valley timings of the triangular wave carrier. In the ideal condition with no delay in detection by the current sensor, the center value of the current ripple is acquired. In actuality, however, a value deviated from the center value of the current ripple is acquired due to delayed detection by the current sensor or the like. Depending on the delay time, the peak value of the current ripple may be acquired. The deviation of the acquired current value from the center value of the current ripple is called current ripple error. According to the above-mentioned conventional technique, an angle error alone can be corrected but a current ripple error due to delayed detection by the current sensor cannot be decreased.

An object of the present disclosure is to provide a control device for an alternating-current electric motor that, under a PWM control, decreases an error in an acquired current value due to delayed detection by a current sensor and improves the accuracy of control computations.

The control device for an alternating-current electric motor according to the present disclosure includes an inverter, a feedback control computation unit, and an average acquisition unit. The inverter converts direct-current power to alternating-current power by operations of a plurality of switching elements subjected to a PWM control, and supplies the alternating-current power to the alternating-current electric motor.

The "alternating-current electric motor" herein includes an alternating current-driven motor, power generator, and motor generator under which, for example, a motor generator that is used as a main machine for a hybrid automobile or an electric automobile to generate torque for driving drive wheels falls. In addition, for example, a control device for controlling energization to the motor generator falls under a "control device for an alternating-current electric motor".

The feedback control computation unit uses a current value acquired from one or more current sensors detecting a current flowing to the alternating-current electric motor and a rotation angle of the alternating-current electric motor to perform a control computation in an (N/2) cycle (N is a natural number) of a triangular wave carrier of the PWM control. At the acquisition of the current value detected by the current sensor, the average acquisition unit acquires an average of the current values in a carrier half cycle as a period between a peak and a valley of the carrier, or acquires a current value regarded as an average of the current values at an acquirable timing.

In the present disclosure, focusing on a current ripple in the PWM control, the average acquisition unit acquires the average of the current values in the carrier half cycle corresponding to the center value of the current ripple. The feedback control computation unit uses the current value acquired by the average acquisition unit and the rotation angle to perform control computations of vector control and feedback control. Accordingly, it is possible to, in the PWM control, decrease an error in the acquired current value due to delayed detection by the current sensor and improve the accuracy of the control computations.

The time during which a current signal flowing to the alternating-current electric motor passes through the current sensor and a reception circuit of the control device and then is recognized as a value usable for the control computation will be defined as "detection delay time". In an embodiment of the present disclosure, the average acquisition unit acquires the current value detected by the current sensor at a timing delayed by the detection delay time from a timing of a peak or valley of the carrier. In this embodiment, the value regarded as the average of the current values in the carrier half cycle can be acquired as appropriate only by a logic of adjusting the current acquisition timing.

The rotation angle of the alternating-current electric motor is based on the premise that there is no delay in detection. The average acquisition unit may acquire the rotation angle of the alternating-current electric motor at a timing of a peak or valley of the carrier. Alternatively, the average acquisition unit may acquire the rotation angle of the alternating-current electric motor together with the corresponding current value at the timing delayed by the detection delay time from a timing of a peak or valley of the carrier. In this case, a corrected rotation angle obtained by subtracting a correction value corresponding to the amount of change in rotation angle at the detection delay time from the acquired rotation angle is preferably used for the control computations.

In another embodiment of the present disclosure, the average acquisition unit calculates an average of current values sampled plural times in a continuous acquisition period set to a length within the carrier half cycle. In this embodiment, it is possible to calculate the average of the current values in the carrier half cycle without influence of variations in detection delay time due to temperature characteristics and time degradation of components.

Hereinafter, a plurality of embodiments of a control device for an alternating-current electric motor will be described with reference to the drawings. First to fifth embodiments will be collectively called "present embodiment". The control device for the alternating-current electric motor according to the present embodiment controls energization to a motor generator (hereinafter, called "MG") as a three-phase alternating-current motor in a system that drives the MG as a power source for a hybrid automobile or electric automobile. The "MG" and "MG control device" in each of the embodiments correspond to an "alternating-current electric motor" and a "control device for an alternating-current electric motor."

[System Configuration]

First, an overall configuration of an MG drive system to which the MG control device according to each of the embodiments will be described with reference to FIG. 1. FIG. 1 illustrates a system including one MG as an example. The MG drive system 90 converts direct-current power from a battery 11 as a chargeable/dischargeable secondary battery to three-phase alternating-current power by an inverter 20 and supplies the same to the MG 80. In the MG drive system 90, an MG control device 10 mainly includes the inverter 20 and an inverter control unit 30. The MG control device 10 may be applied to an MG drive system including a converter that raises the voltage of the battery 11 and outputs the same to the inverter 20. In addition, the MG control device 10 is also applicable to an MG drive system including two or more MGs in the same manner.

The MG 80 is a permanent-magnet synchronous three-phase alternating-current motor, for example. In the present embodiment, the MG 80 includes both the function of an electric motor that generates torque for driving the drive wheels of a hybrid automobile and the function of a power generator that recovers energy from the torque transferred from the engine and the driving wheels by power generation.

A current sensor to detect a phase current is provided in a current path connected to one or more of three-phase windings 81, 82, and 83 of the MG 80. In the example of FIG. 1, current sensors 87 and 88 to detect phase currents Iv and Iw are provided in current paths connected to the V-phase winding 82 and the W-phase winding 83, and the remaining U-phase current Iu is estimated based on Kirchihoff's law. In another embodiment, any two of the phase currents may be detected or the three-phase currents may be detected. Alternatively, a technique for estimating two phase currents based on the one-phase current detection value may be adopted.

A rotation angle sensor 85 detects a rotation angle θ of the MG 80. The present embodiment assumes that a resolver is used as the rotation angle sensor 85, but another rotation angle sensor may be used. The rotation angle θ here means an electrical angle obtained by dividing a mechanical angle by the number of pole pairs. In the description of the embodiments, the rotation angle of the MG 80 will be simply called "angle" as appropriate. In another embodiment, in a position sensor-less control system without a rotation angle sensor, the MG control device 10 may acquire an estimated rotation angle.

The inverter 20 has six bridge-connected switching elements 21 to 26 of upper and lower arms. More specifically, the switching elements 21, 22, and 23 are respectively the upper-arm switching elements of U phase, V phase, and W phase, and the switching elements 24, 25, and 26 are respectively the lower-arm switching elements of U-phase, V-phase, and W-phase. The switching elements 21 to 26 are formed from IGBTs, for example, which have reflux diodes connected in parallel to permit current flowing from the low-potential side to the high-potential side.

The inverter 20 converts direct-current power to three-phase alternating-current power by the switching elements 21 to 26 operating according to gate signals UU, UL, VU, VL, WU, and WL from the inverter control unit 30. Then, the inverter 20 applies respectively phase voltages Vu, Vv, and Vw corresponding to voltage commands computed by the inverter control unit 30 to the phase windings 81, 82, and 83. A smoothing capacitor 15 smooths out a system voltage Vsys input to the inverter 20. The system voltage Vsys is detected by a voltage sensor 27, for example.

The inverter control unit 30 is formed from a microcomputer or the like and includes a CPU, a ROM, an I/O, a bus line connecting these components, which are not illustrated in the drawings, and the like. The microcomputer executes controls through software processing by the CPU executing pre-stored programs and through hardware processing by a dedicated electronic circuit.

The two phase currents Iv and Iw detected by the current sensors 87 and 88 and the rotation angle θ detected by the rotation angle sensor 85 are input to the inverter control unit 30. A torque command Trq* is also input from a higher-level control circuit to the inverter control unit 30. Based on the foregoing information, the inverter control unit 30 computes the gate signals UU, UL, VU, VL, WU, and WL for operating the inverter 20. With the switching elements 21 to 26 operating according to the gate signals UU, UL, VU, VL, WU, and WL, the inverter 20 converts the direct-current power input from the battery 11 to alternating-current power and supplies the same to the MG 80.

[Configuration of the Inverter Control Unit]

Figure 2:
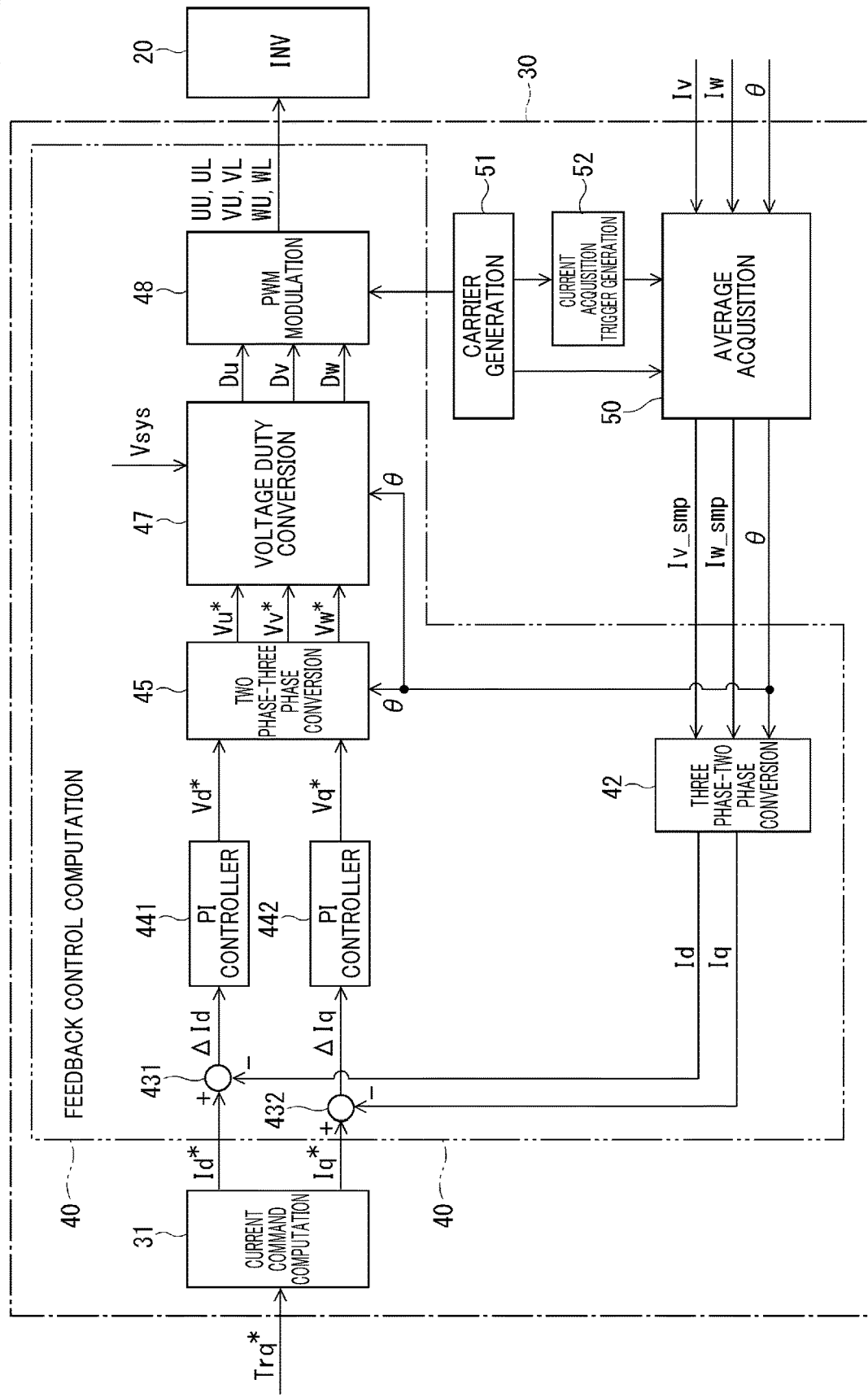
FIG. 2 is a control block diagram of an inverter control unit illustrated in FIG. 1.

Next, a configuration of the inverter control unit 30 will be described with reference to FIG. 2. The inverter control unit 30 according to the present embodiment is basically configured to perform a vector control, a current feedback control, and a PWM control. In addition, the inverter control unit 30 according to the present embodiment has an average acquisition unit 50 and others as unique components. Based on the torque command Trq*, a current command computation unit 31 computes a d-axis current command Id* and a q-axis current command Iq* using maps and numerical formulae.

A three phase-two phase conversion unit 42 accepts inputs of a V-phase current sample value Iv_smp, a W-phase current sample value Iw_smp, and the rotation angle θ from the average acquisition unit 50. These phase current sample values Iv_smp and Iw_smp and the rotation angle θ are ideally data obtained at the same timing. Hereinafter, the current value and the rotation angle ideally obtained at the same timing will be called "current value and rotation angle corresponding to each other".

The three phase-two phase conversion unit 42 uses the rotation angle θ to convert the phase current sample values Iv_smp and Iw_smp to the dq-axis currents Id and Iq, and feeds the same back. Current subtractors 431 and 432 calculates current deviations ΔId and ΔIq between the d-axis current Id, the q-axis current Iq fed back from the three phase-two phase conversion unit 42 and the d-axis current command Id*, the q-axis current command Iq*.

PI controllers 441 and 442 respectively calculate a d-axis voltage command Vd* and a q-axis voltage command Vq* by proportional integral computation to converge the d-axis current deviation ΔId and the q-axis current deviation ΔIq to zero. The PI controllers may be configured as PID controllers also performing differential computation. Besides the feedback terms calculated by the PI controllers 441 and 442, separately calculated feedforward terms may be added to the d-axis voltage command Vd* and the q-axis voltage command Vq*.

A two phase-three phase conversion unit 45 uses the rotation angle θ to convert the dq-axis voltage commands Vd* and Vq* to three phase voltage commands Vu*, Vv*, and Vw*. A voltage duty conversion unit 47 converts the phase voltage commands Vu*, Vv*, and Vw* to command duties Du, Dv, and Dw based on the system voltage Vsys and the rotation angle θ.

A PWM modulation unit 48 compares the phase command duties Du, Dv, and Dw with the carrier to generate the gate signals UU, UL, VU, VL, WU, and WL for operating the switching elements 21 to 26 of the inverter 20, and outputs the gate signals to the inverter 20. The element group of the three phase-two phase conversion unit 42 to the PWM modulation unit 48 described above will be called feedback control computation unit 40. The feedback control computation unit 40 performs a series of feedback control computations based on the current values and angle data input from the average acquisition unit 50.

Subsequentially, a carrier generation unit 51, a current acquisition trigger generation unit 52, and the average acquisition unit 50 will be described. The carrier generation unit 51 generates a triangular wave carrier of PWM control and outputs the same to the PWM modulation unit 48. The triangular wave carrier has a symmetric shape in which the period from a peak to a valley and the period from a valley to a peak are identical, and the period between a peak and a valley of the carrier will be defined as carrier half cycle. Any known techniques for changing a carrier frequency or the like may be adopted according to the number of rotations and the modulation factor of the MG 80. In a PWM control, conventionally, the timing of a peak or a valley of the carrier has been used as a timing for acquiring the phase currents detected by the current sensors 87 and 88 and the angle detected by the rotation angle sensor 85. As described later, ideally, sampling currents at a timing of a peak or a valley of the carrier makes it possible to acquire the center value of a current ripple.

In reality, however, there occurs an error between the current acquired by a control device and the actual current due to a delay in detection by the current sensor. This problem will be described with reference to FIGS. 3 to 6. There occurs no substantial delay in the rotation angle θ detected by the resolver. Therefore, in the present embodiment in which the resolver is used as the rotation angle sensor 85, only a delay in detection by the current sensor is addressed on the premise that there is no delay in the detection of the rotation angle θ.

Figure 3:
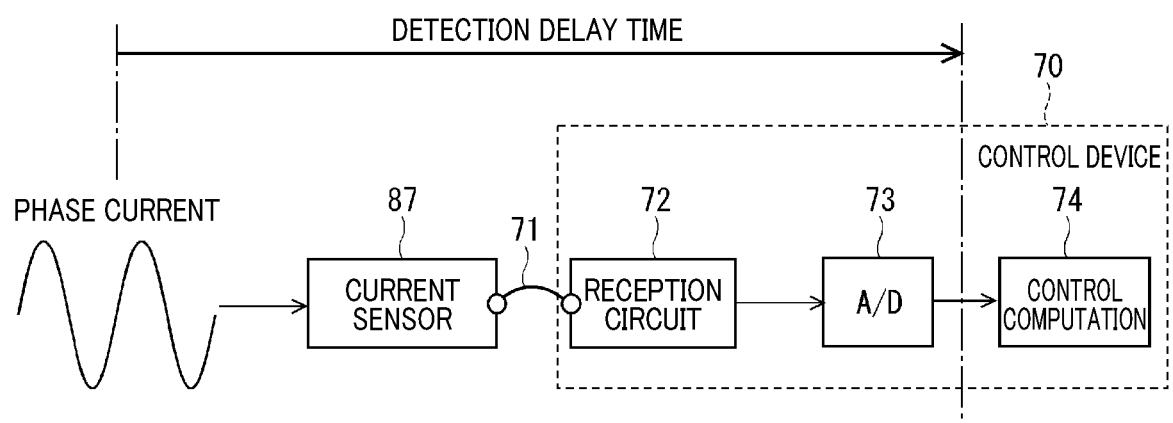
FIG. 3 is a diagram for defining a detection delay time of a current sensor.

FIG. 3 illustrates a general configuration for a control device to acquire the current value detected by a current sensor. In FIG. 3, the current sensor is given the reference sign "87" of the V-phase current sensor illustrated in FIG. 1. The current sensor 87 detects the phase current as an analog signal and transmits the same to a control device 70 connected via a connector 71. A reception circuit 72 of the control device 70 receives the analog signal from the current sensor 87. An A/D conversion unit 73 converts the analog signal to a digital signal, and outputs the same to a control computation unit 74. The time during which the current signal passes through the current sensor 87 and the reception circuit 72 of the control device 70 and is recognized as a value usable for control computation will be defined as "detection delay time".

Figure 4:
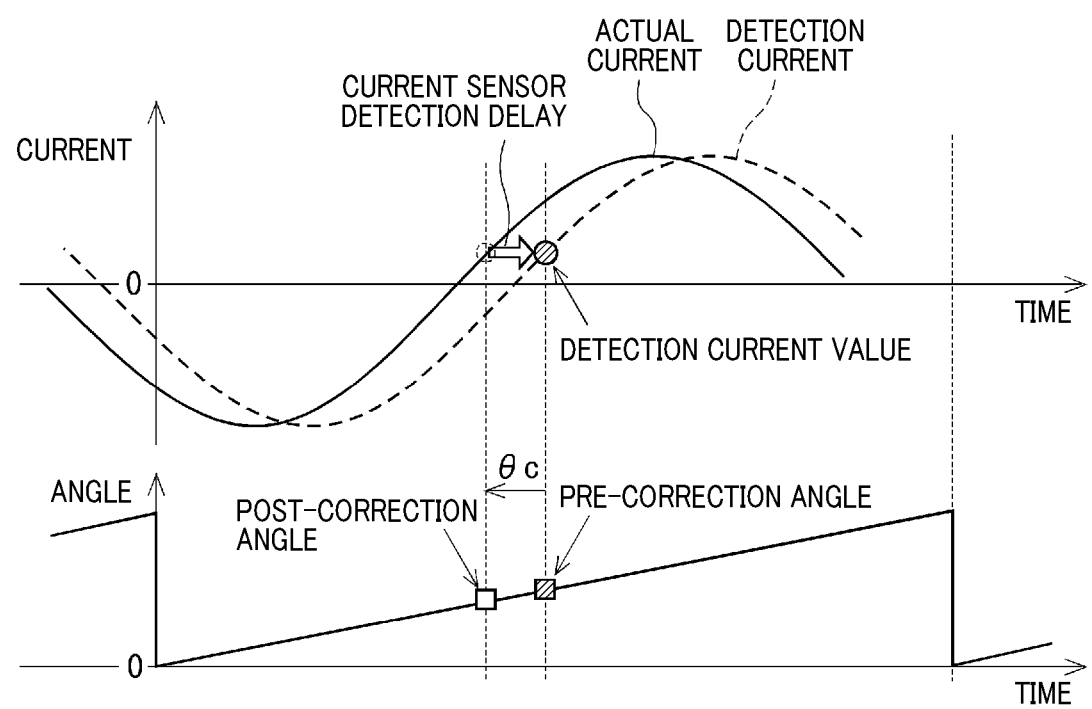
FIG. 4 is a time chart for describing angle correction based on a conventional issue.

As illustrated in FIG. 4, the detection current lags behind the actual current due to a delay in detection by the current sensor. According to the above-mentioned conventional technique, the angle of the dq coordinate axes is corrected by the phase θc corresponding to the delay time of the current sensor with respect to the delay in detection by the current sensor. This makes it possible to correct the angle error.

Figure 5:
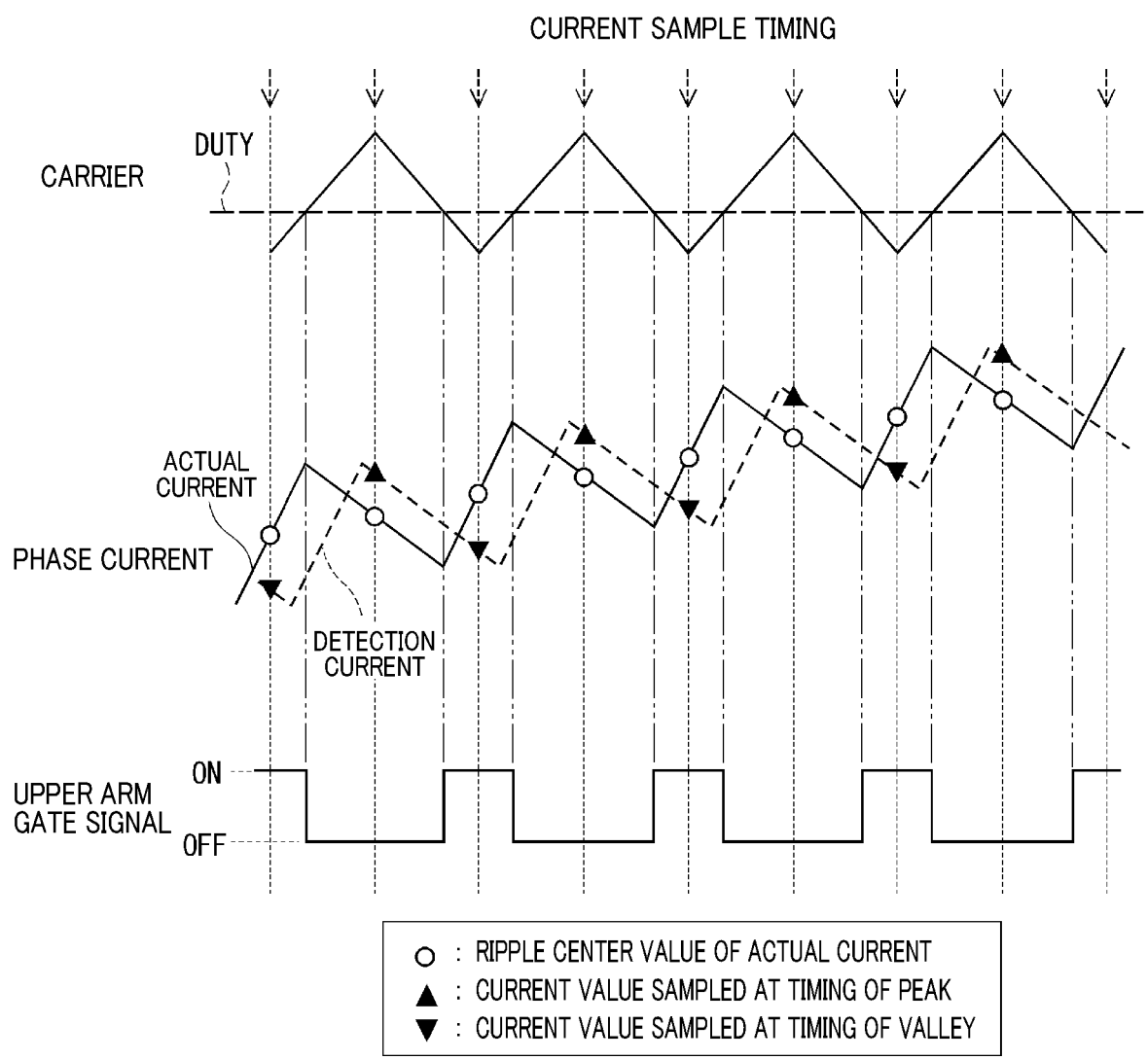
FIG. 5 is a diagram describing a current ripple in a PWM control.

However, referring to FIG. 5 as a time chart of a shorter time range, in the PWM control, the switching element is turned on and off depending on the relationship in magnitude between a carrier and a duty. In the time charts describing the timings based on the carrier in common among the phases, the command duties Du, Dv, and Dw illustrated in FIG. 2 are collectively represented as "DUTY". The DUTY means the ratio of the ON time of the upper arm element to the switching cycle. During the periods in which the DUTY exceeds the carrier, the gate signal is ON.

The actual current rises in the ON period of the gate signal and falls in the OFF period of the gate signal, thereby to cause a ripple. As shown by white circles, the actual current at the timings of a valley of the carrier corresponds to the center value of the ripple at the rising time, and the actual current at the timings of a peak of the carrier corresponds to the center value of the ripple at the falling time.

When the detection current lagging behind the actual current is sampled at the timings of a peak or a valley of the carrier, the current value at the timings of a valley of the carrier is smaller than the center value of the ripple as shown by downward triangle marks. The current value at the timings of a peak of the carrier is larger than the center value of the ripple as shown by upward triangle marks. Depending on the detection delay time, the peak value of the current ripple may be sampled at the timings of a peak or a valley of the carrier. The deviation of the acquired current value from the center value of the current ripple will be called current ripple error. According to the above-mentioned conventional technique, it is not possible to reduce the current ripple error resulting from a delay in detection by the current sensor.

Figure 6:
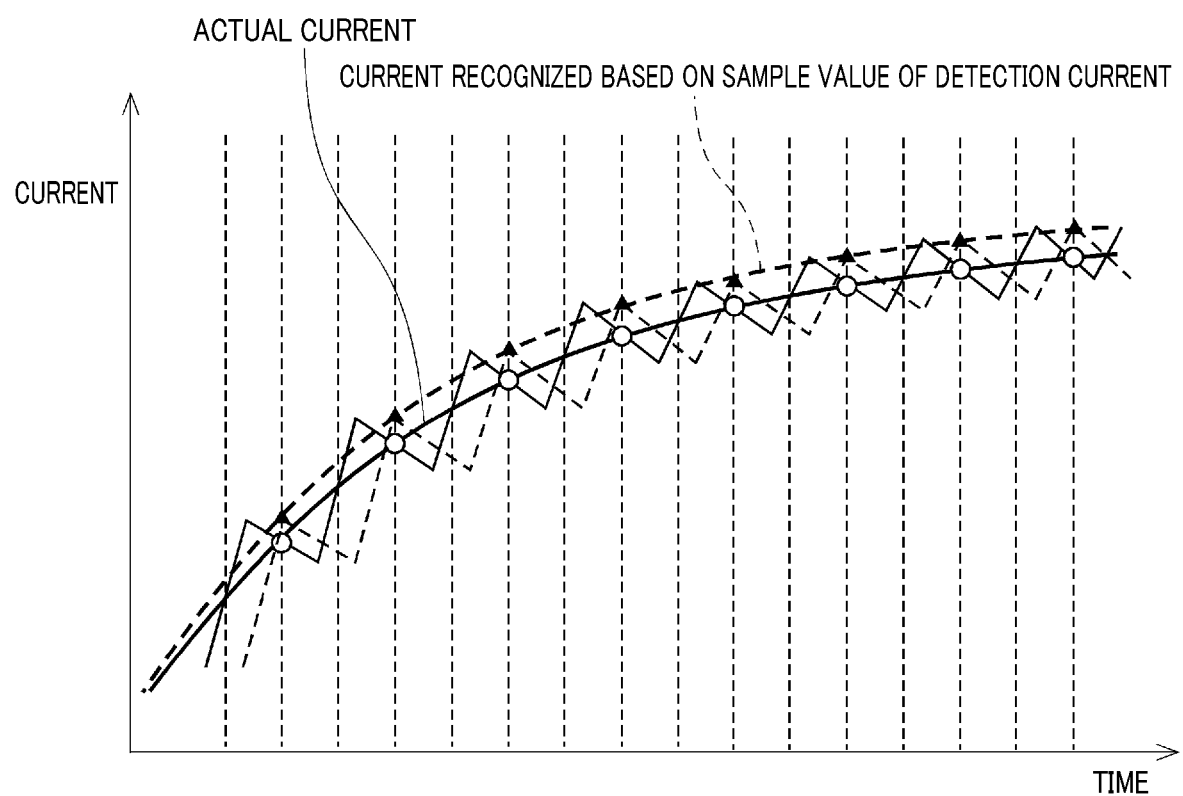
FIG. 6 is a diagram describing influence of delayed detection by the current sensor.

Consequently, as illustrated in FIG. 6, a current amplitude effective value of a current waveform recognized based on the sampled values of the detection current has an error with respect to a current amplitude effective value of the actual current. The amount of the error fluctuates depending on the magnitude of the current ripple and the detection delay time. When feedback control computation is performed based on the current value including the error, the accuracy of the output torque of the MG 80 deteriorates with respect to the desired torque command Trq*.

To solve this problem, the inverter control unit 30 in the present embodiment includes the average acquisition unit 50 that acquires an average of the current values in the carrier half cycle at the time of acquisition of the current values detected by the current sensors 87 and 88. The average of the current values in the carrier half cycle is a value corresponding to the center value of the current ripple. The current acquisition trigger generation unit 52 commands the timing for the average acquisition unit 50 to acquire the current value. The terms "acquisition" and "sampling" are used herein in almost the same meaning.

Next, a specific configuration of the average acquisition unit 50 will be described in relation to each of the embodiments. The embodiments described below are broadly divided into the first to fourth embodiments and the fifth embodiment. In the first to fourth embodiments, the average acquisition unit 50 acquires the currents detected by the current sensors 87 and 88 at timings delayed by a predetermined time from the timings of a peak or a valley of the carrier, thereby to acquire the value regarded as an average of the current values in the carrier half cycle. On the other hand, in the fifth embodiment, the average acquisition unit 50 calculates the average of the current values in the carrier half cycle.

That is, in the first to fourth embodiments, the detection current is acquired at the timings set as "optimum timings for acquiring the detection current value regarded as an average". Accordingly, the average acquisition process in the first to fourth embodiments will be called "assumed average acquisition process". On the other hand, in the fifth embodiment, the average of the current values in the carrier half cycle is literally calculated. The average acquisition process in the fifth embodiment will be called "average calculation process".

First Embodiment

Figure 7:
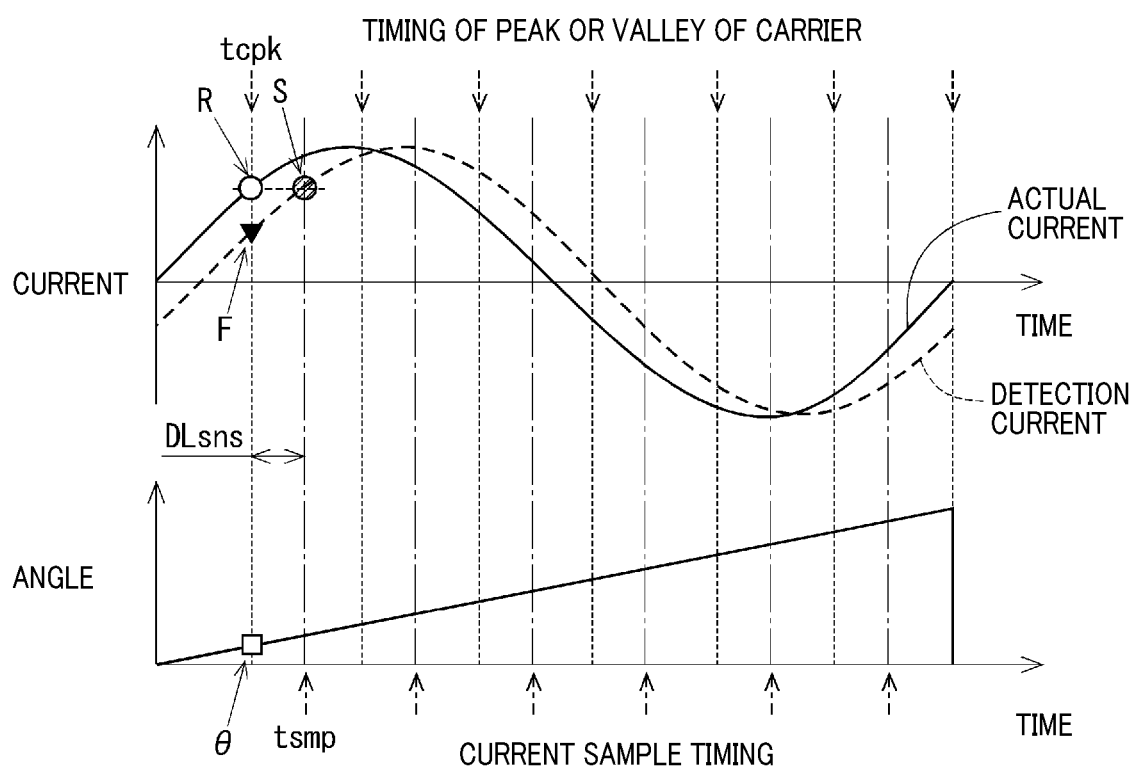
FIG. 7 is a conceptual diagram of an assumed average acquisition process according to a first embodiment.

The first embodiment will be described with reference to FIGS. 7 to 10. FIG. 7 illustrates the relationship between the phase current and the angle in one electrical angle cycle and current sample timings in an arbitrary phase. Vertical broken lines indicate the timings of a peak or valley of the carrier. A current value R shown by a white circle mark on the broken line indicates the actual current at a timing tcpk of a peak or valley of the carrier, and a current value F shown by a triangle mark indicates the detection current at the timing tcpk. Since the embodiment is based on the premise that there is no detection delay in the angle as described above, an angle θ shown by a square mark indicates the actual angle at the timing of a peak or a valley of the carrier and indicates the detection angle acquired at the timing tcpk.

In the ideal state in which the detection current coincides with the actual current without delay, when the detection current is sampled at the timing of a peak or a valley of the carrier, the current value R and the angle θ corresponding to each other are acquired with accuracy. In reality, however, the detection current lags by a detection delay time DLsns behind the actual current, and thus there arises an error in the correspondence between the current value F sampled at the timing of a peak or a valley of the carrier and the angle θ.

Accordingly, in the first embodiment, the timing delayed by the detection delay time DLsns from the timing tcpk of a peak or valley of the carrier is set as a current sample timing tsmp shown by one-dot chain lines. A current value S shown by a hatched circle mark on the one-dot chain line indicates the detection current at the current sample timing tsmp. In the first embodiment, only the current is sampled at the current sample timing tsmp and the angle θ is sampled at the timing tcpk of a peak or valley of the carrier, so that the current value S and the angle θ corresponding to each other are accurately acquired as in the ideal state. The current value S corresponds to the V-phase current Iv_smp and the W-phase current Iw_smp output from the average acquisition unit 50 illustrated in FIG. 2.

Figure 8:
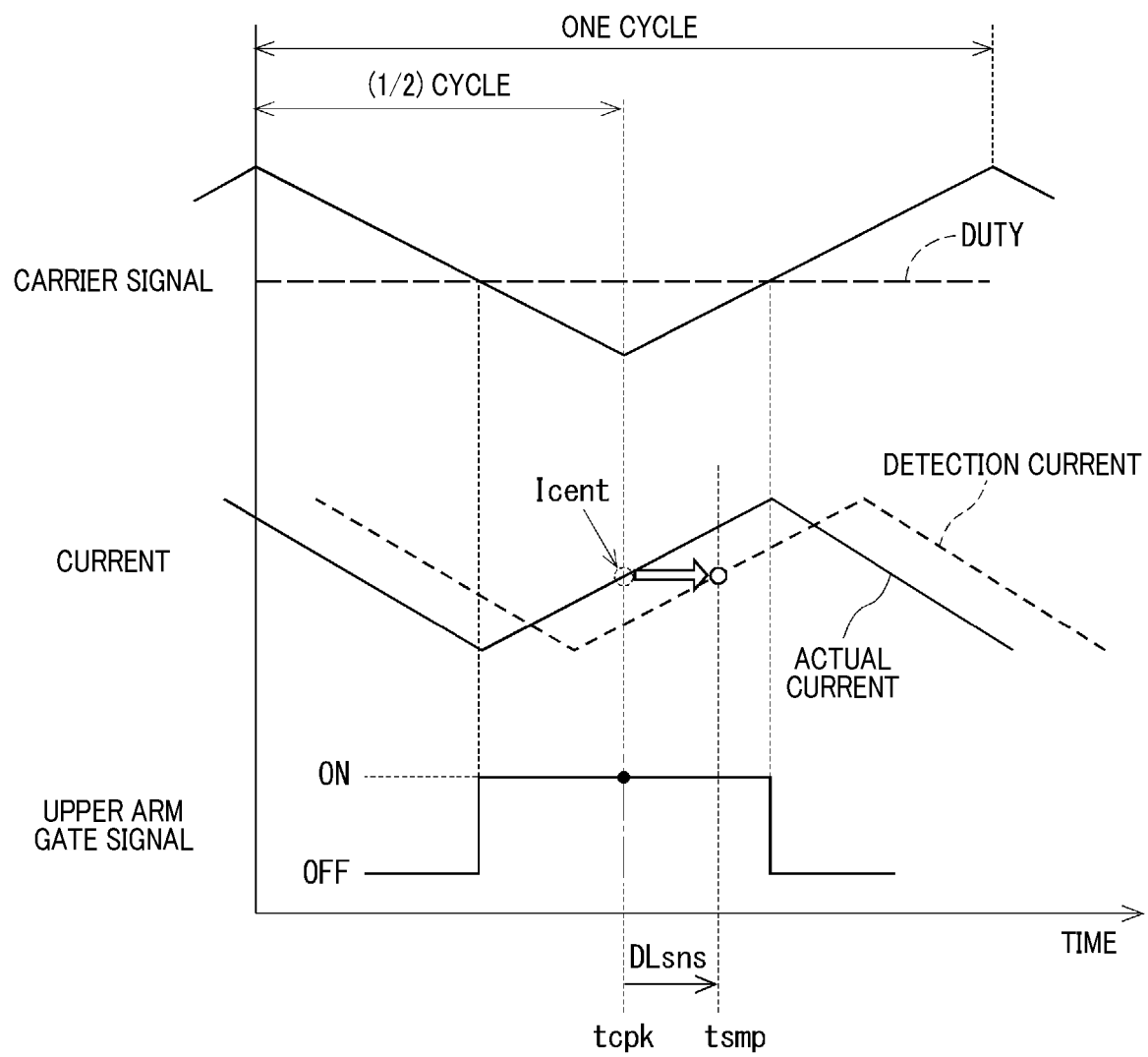
FIG. 8 is a time chart illustrating the relationship between a phase current and angle in one electrical angle cycle and a current sample timing according to the first embodiment.

FIG. 8 is a time chart of a time range shorter than that in FIG. 7, which indicates the relationship among the actual current, the detection current, and the gate signal commanded to the upper arm element in one cycle of a carrier signal. The gate signal is ON during the period in which the DUTY exceeds the carrier signal. In the first embodiment, the period in which the upper arm element is actually ON coincides with the ON period of the gate signal. The average acquisition unit 50 in the first embodiment samples the detection current at the timing tsmp delayed by the detection delay time DLsns from the timing tspk of a peak or valley of the carrier.

Figure 9:
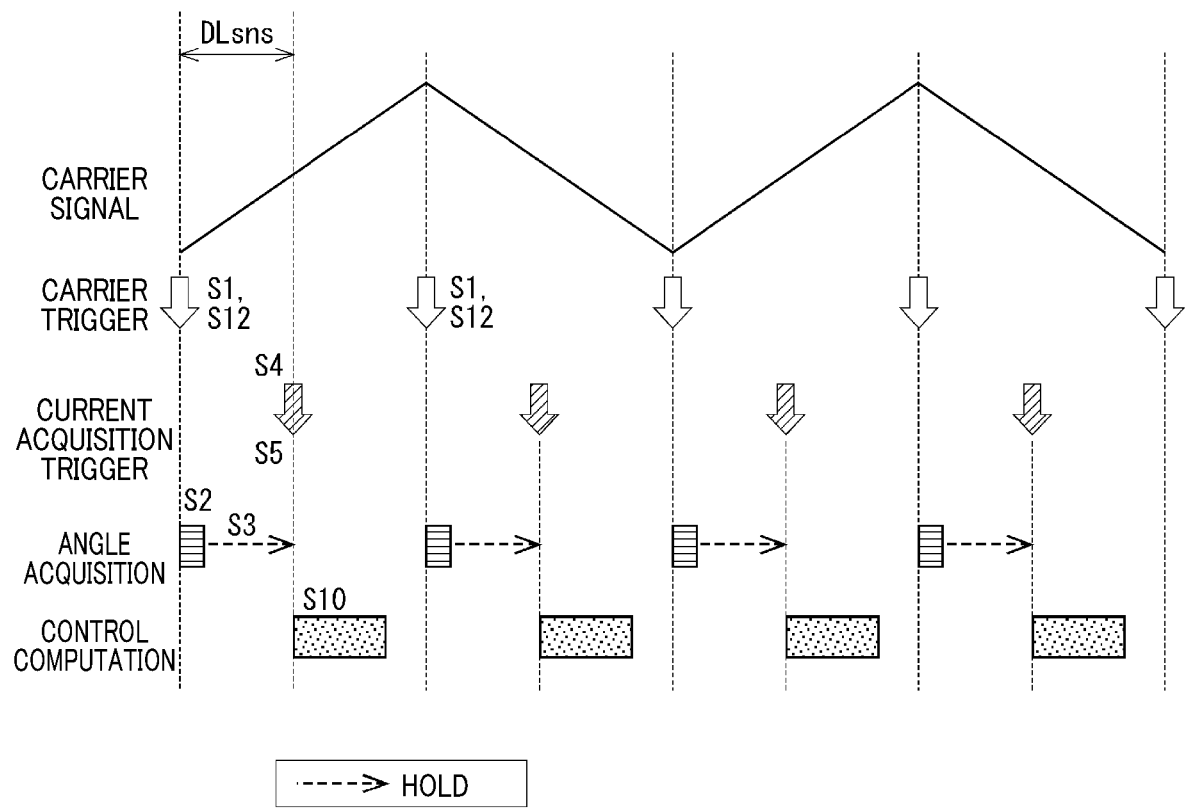
FIG. 9 is a time chart of the assumed average acquisition process according to the first embodiment.

Subsequently, a time chart illustrated in FIG. 9 and a flow chart illustrated in FIG. 10 will be referred to. The time chart illustrated in FIG. 9 indicates two carrier cycles. In the example of FIG. 9, the current and angle in one or more phases are acquired at each of the timings of a peak or valley of the carrier, that is, in each ½ cycle, and these values are used to execute various control computations. In the present embodiment, the various control computations are terminated before the next timing of a peak or valley of the carrier, and are updated at the start of the next ½ cycle.

Referring to FIG. 9, hollow block arrows indicate timings for the carrier generation unit 51 to generate a carrier trigger. That is, the timings to generate the carrier trigger constitute the "timings of a peak or valley of the carrier". Obliquely hatched block arrows indicate timings for the current acquisition trigger generation unit 52 to generate a current acquisition trigger. In the first embodiment, when detection currents are acquired from a plurality of current sensors, a common current acquisition trigger is used for the detection currents of the current sensors. Horizontally hatched rectangles indicate timings to acquire angle data. Broken-line arrows indicate periods in which the acquired angle data is held. dot-filled rectangles indicate periods in which various control computations are executed. Numbers with symbol S indicate step numbers in the flow chart of FIG. 10.

Referring to FIG. 9, the current acquisition trigger is generated after a lapse of the detection delay time DLsns from the carrier trigger. The angle is acquired at each of the timings to generate the carrier trigger and is held until the timing to generate the current acquisition trigger. The control computation is started at each of the timings to generate the current acquisition trigger and is terminated before the next timing to generate the carrier trigger.

Figure 10:
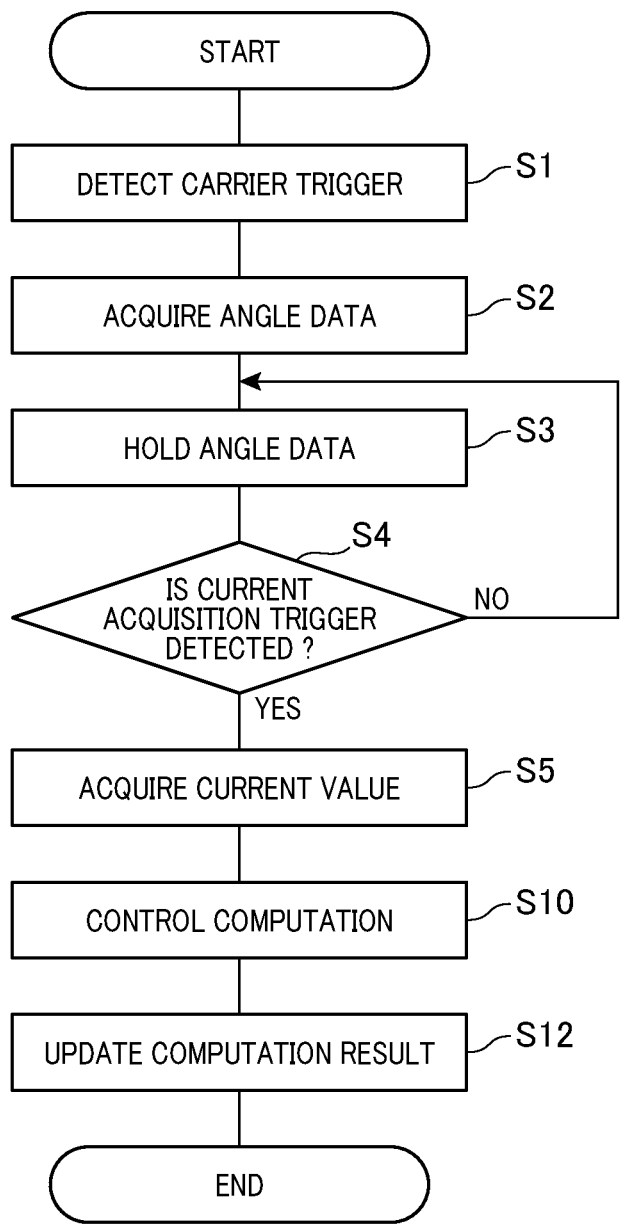
FIG. 10 is a flow chart of the assumed average acquisition process according to the first embodiment.

In the descriptions of the flow charts illustrated in FIG. 10 and the subsequent drawings, the symbol "S" refers to step. Since the step numbers are shared with the flow charts in the other embodiments, some of the step numbers may be missed for each of the embodiments. Referring to FIG. 10, S1 to S5 are performed by the average acquisition unit 50, and S10 and S12 are performed by the feedback control computation unit 40. The average acquisition unit 50 detects a carrier trigger in S1, simultaneously acquires the angle data from the rotation angle sensor 85 in S2, and holds the angle data in S3. The holding the angle data in S3 continues until it is determined in S4 that a current acquisition trigger has been detected. When the current acquisition trigger has been detected and a YES determination is made in S4, the average acquisition unit 50 acquires current values from the current sensors 87 and 88 of the respective phases in S5.

Accordingly, the average acquisition unit 50 acquires the current value and the angle corresponding to each other in one or more phases, and outputs the same to the feedback control computation unit 40. The feedback control computation unit 40 uses the current value and the angle output from the average acquisition unit 50 to perform control computations in S10.

The feedback control computation unit 40 also updates the computation result at the next timing of a peak or valley of the carrier in S12.

Advantageous Effects

Advantageous effects of the MG control device 10 according to the first embodiment will be described.

(1) The average acquisition unit 50 acquires the average of the current values in the carrier half cycle corresponding to the center value of the current ripple in the PWM control. The feedback control computation unit 40 uses the current values and the angle acquired by the average acquisition unit 50 to perform control computations such as a vector control and a feedback control. This makes it possible to reduce an error in the acquired current values due to delayed detection by the current sensors 87 and 88 in the PWM control and improve the accuracy of the control computations.

(2) The average acquisition unit 50 acquires the current values detected by the current sensors 87 and 88 at a timing delayed by the detection delay time DLsns from the timing of a peak or valley of the carrier. This makes it possible to acquire the value regarded as an average of the current values in the carrier half cycle only by a logic of adjusting the current acquisition timing.

(3) After the average acquisition unit 50 acquires the current values and angle corresponding to each other, the feedback control computation unit 40 starts the control computations using the current value and the rotation angle. Using the data obtained at the same timing as a set makes it possible to improve the accuracy of the control computations.

In relation to the second to fifth embodiments described below, the descriptions in the time charts conform with those illustrated in FIGS. 7, 8, and 9 of the first embodiment. Steps essentially identical to those in the first embodiment illustrated in FIG. 10 will be given identical step numbers and descriptions thereof will be partially omitted.

Second Embodiment

Figure 11:
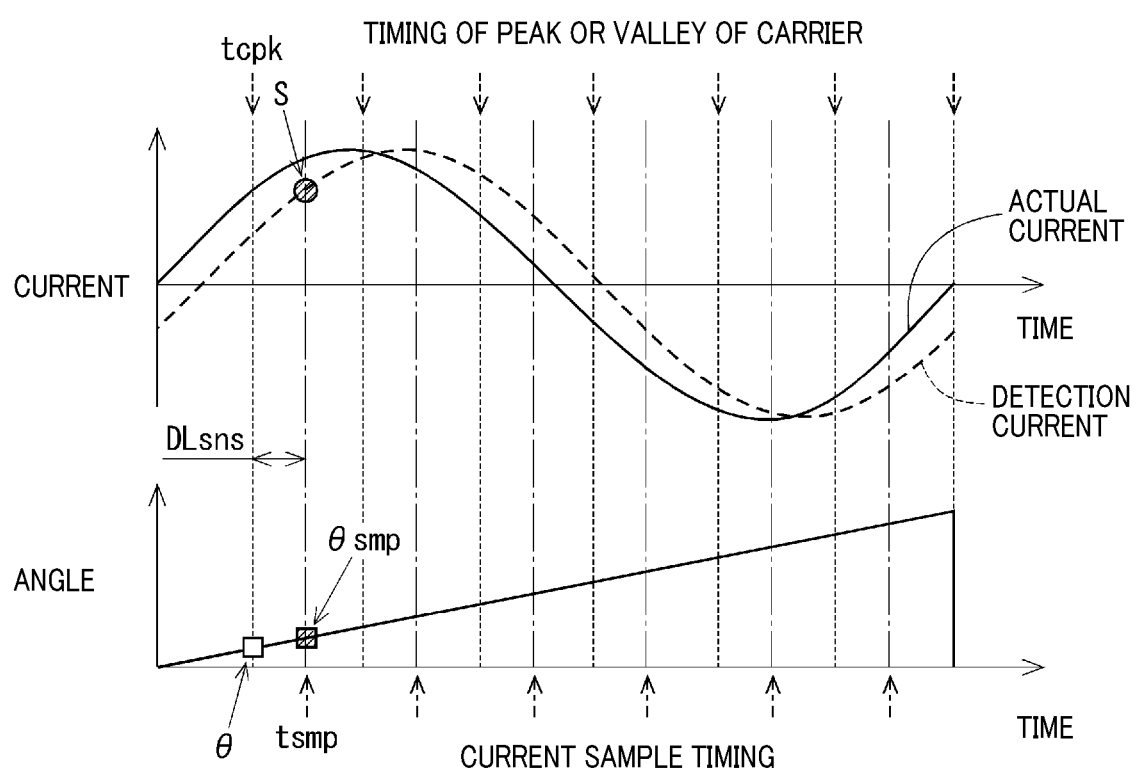
FIG. 11 is a time chart illustrating the relationship between the phase current and angle of one electrical angle cycle and a current sample timing according to a second embodiment.

The second embodiment will be described with reference to FIGS. 11 to 14. The second embodiment is different from the first embodiment only in angle acquisition timing. As illustrated in FIG. 11, an average acquisition unit 50 acquires simultaneously a current value S and an angle θsmp at a timing delayed by a detection delay time DLsns from a timing of a peak or valley of a carrier.

Figure 12A:
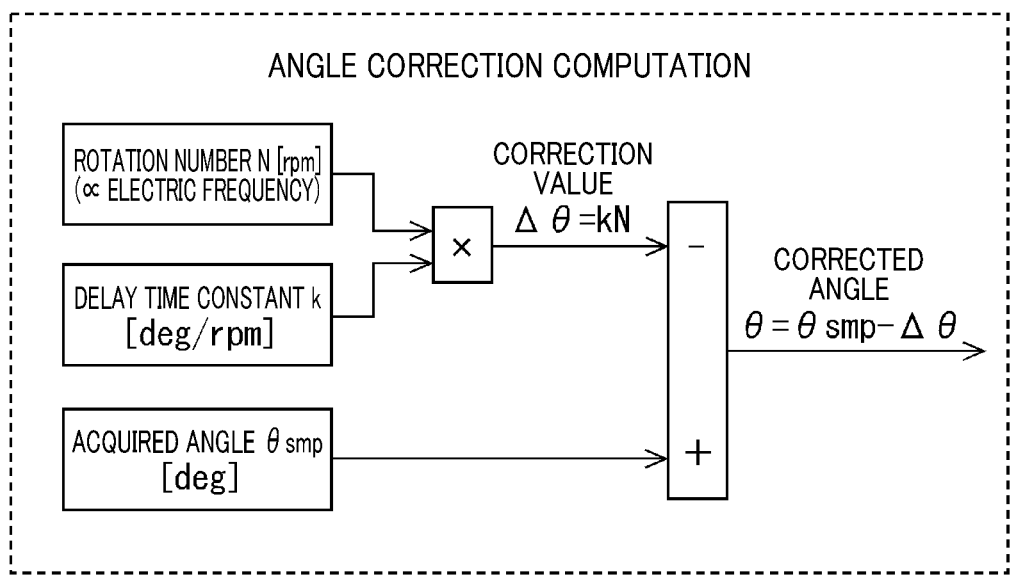
FIG. 12A is a block diagram of angle correction according to the second embodiment.
Figure 12B:
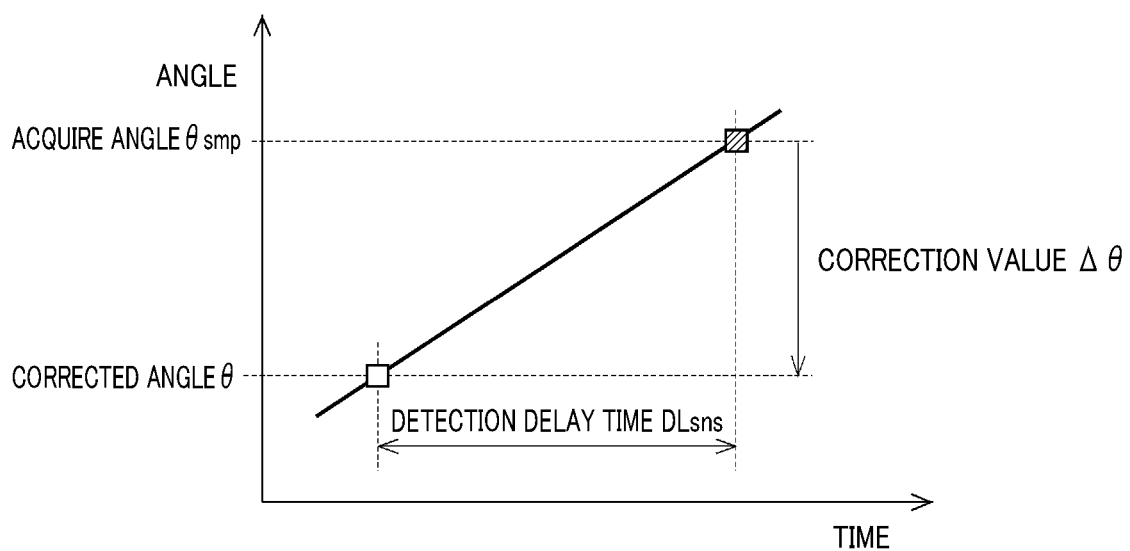
FIG. 12B is a diagram describing angle correction according to the second embodiment.

FIG. 12A illustrates a configuration of angle correction calculation. First, a rotation number N [rpm] proportional to an electric frequency is multiplied by a delay time factor k [deg/rpm] to calculate a correction value Δθ (=kN). Then, the correction value Δθ is subtracted from the acquired angle θsmp to calculate a post-correction angle θ. As illustrated in FIG. 12B, the correction value Δθ corresponds to the amount of an angle change at the detection delay time DLsns. The multiplication of the rotation number N [rpm] by the delay time factor k [deg/rpm] may be replaced with the multiplication of a rotation angular velocity [deg/s] by a delay time [s].

Figure 13:
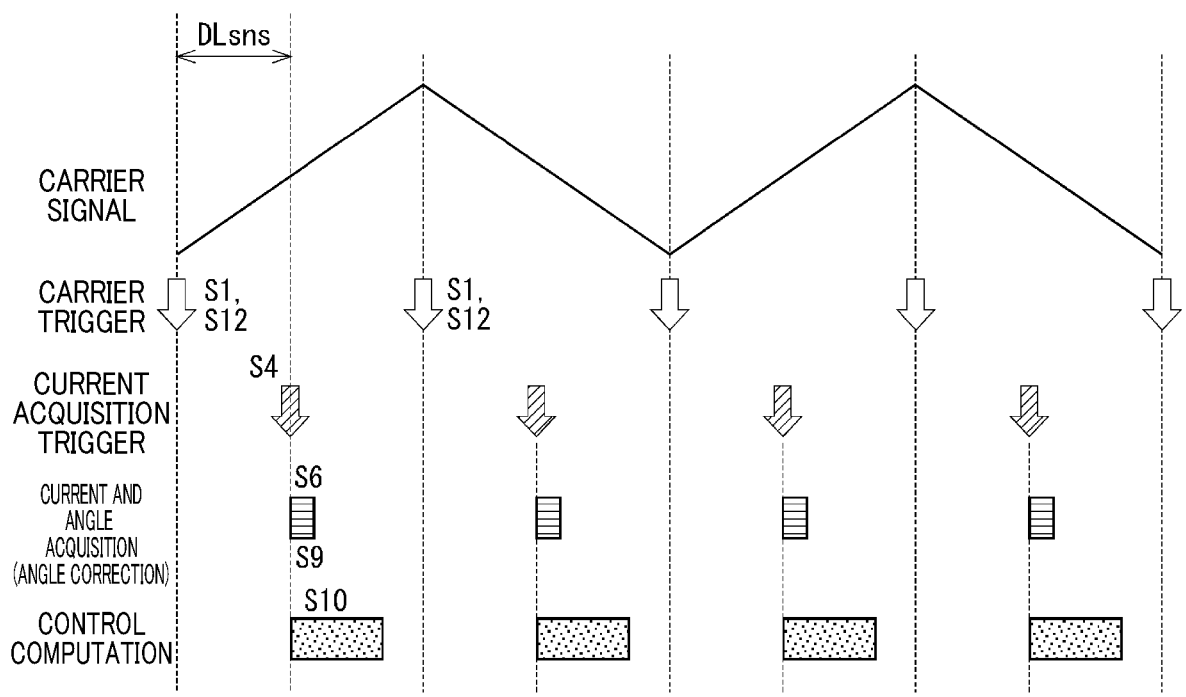
FIG. 13 is a time chart of an assumed average acquisition process according to the second embodiment.
Figure 14:
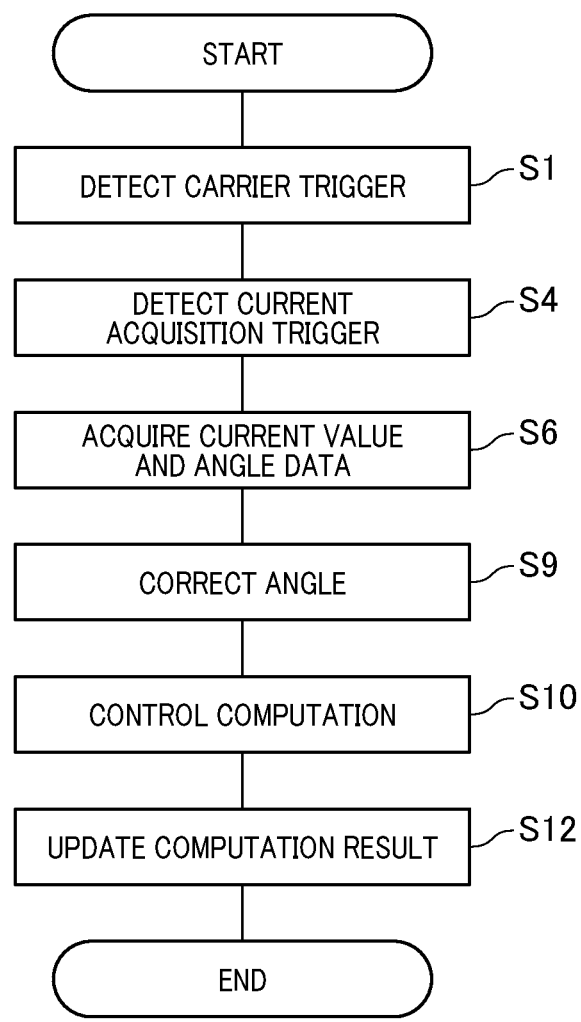
FIG. 14 is a flow chart of the assumed average acquisition process according to the second embodiment.

Subsequently, the time chart illustrated in FIG. 13 and the flow chart illustrated in FIG. 14 are referred to. Referring to FIG. 13, the acquisition of the angle is performed simultaneously with the acquisition of the current at the timing when a current acquisition trigger is generated. Referring to FIGS. 14, S6 and S9 are steps specific to the second embodiment. In S1, the average acquisition unit 50 detects the carrier trigger. After that, the average acquisition unit 50 detects a current acquisition trigger generated by a current acquisition trigger generation unit 52 in S4, and acquires simultaneously the current value and the angle in S6. In S9, the average acquisition unit 50 also corrects the acquired angle θsmp and outputs the acquired current value and the post-correction angle θ to the feedback control computation unit 40.

The feedback control computation unit 40 performs control computations using the current value and the post-correction angle θ output from the average acquisition unit 50 in S50. The average acquisition unit 50 may directly output the acquired angle θsmp so that the feedback control computation unit 40 executes the angle correction. After that, the feedback control computation unit 40 updates the operation result in S12. The second embodiment can produce the same advantageous effects as those of the first embodiment.

Third Embodiment

The third embodiment will be described with reference to FIG. 15. According to the third embodiment, a timing for current acquisition by an average acquisition unit 50 is determined in consideration to not only a delay in detection by current sensors 87 and 88 but also the influence of delayed operations of switching elements of an inverter 20.

Figure 15:
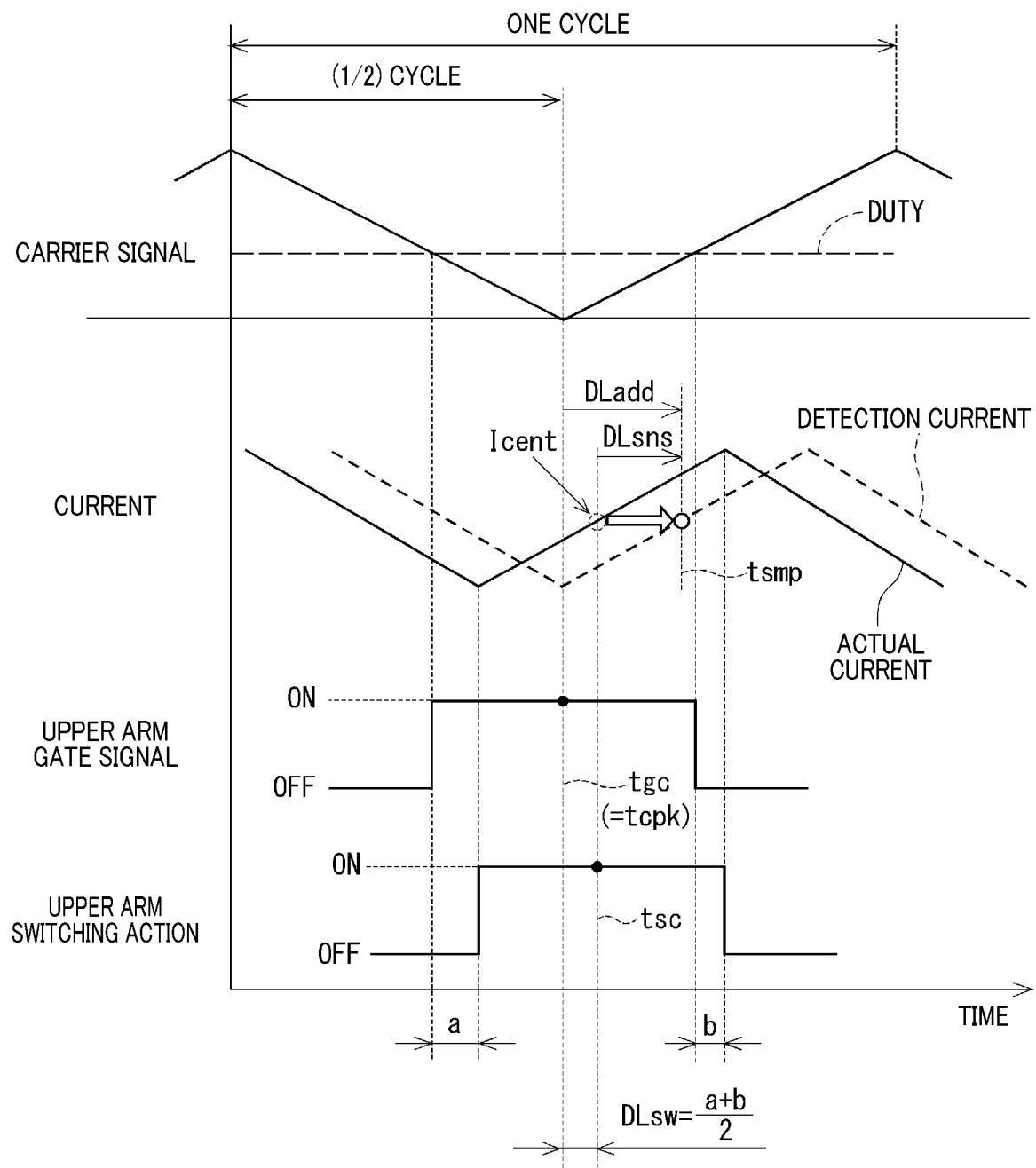
FIG. 15 is a conceptual diagram of an assumed average acquisition process according to a third embodiment.

FIG. 15 illustrates a timing for a gate signal commanded to an upper arm element and a timing for actual switching action of the upper arm element. The delay time of ON action from the gate signal is designated as a, and the delay time of OFF action from the gate signal is designated as b. The delay time between an intermediate point tsc in an ON period of the switching action and an intermediate point tgc in an ON period of the gate signal is represented as "(a+b)/2" as an average delay time of the ON action and the OFF action. The average delay time of the ON action and the OFF action will be defined as "element action delay time DLsw". In this case, the intermediate point tgc in the ON period of the upper arm gate signal coincides with a timing tcpk of a valley of a carrier.

The center value of a ripple of an actual current at the rising time lags by the element action delay time DLsw of the upper arm element behind the timing of a valley of the carrier. The center value of the ripple of the actual current at the falling time lags by the element action delay time DLsw of a lower arm element behind the timing of a peak of the carrier. Therefore, the detection current lags behind the timing tcpk of a peak or valley of the carrier by an added delay time DLadd obtained by adding the element action delay time DLsw to a detection delay time DLsns.

Accordingly, the average acquisition unit 50 in the third embodiment acquires the detection current at a corrected timing delayed by the added delay time DLadd from the timing tcpk of a peak or valley of the carrier. Accordingly, it is possible to avoid the influence of the delayed action of the switching elements and acquire the detection current at the center value of the current ripple with accuracy.

Fourth Embodiment

The fourth embodiment will be described with reference to the time chart illustrated in FIG. 16 and the flow chart illustrated in FIG. 17. In the first embodiment, the common detection delay time DLsns is used on the assumption that the two current sensors 87 and 88 detecting a V-phase current Iv and a W-phase current Iw have substantially equal characteristics. In contrast, in the fourth embodiment, focusing on variations in the characteristics of two current sensors 87 and 88, a detection delay time DLsns is set for each of the current sensors.

Figure 16:
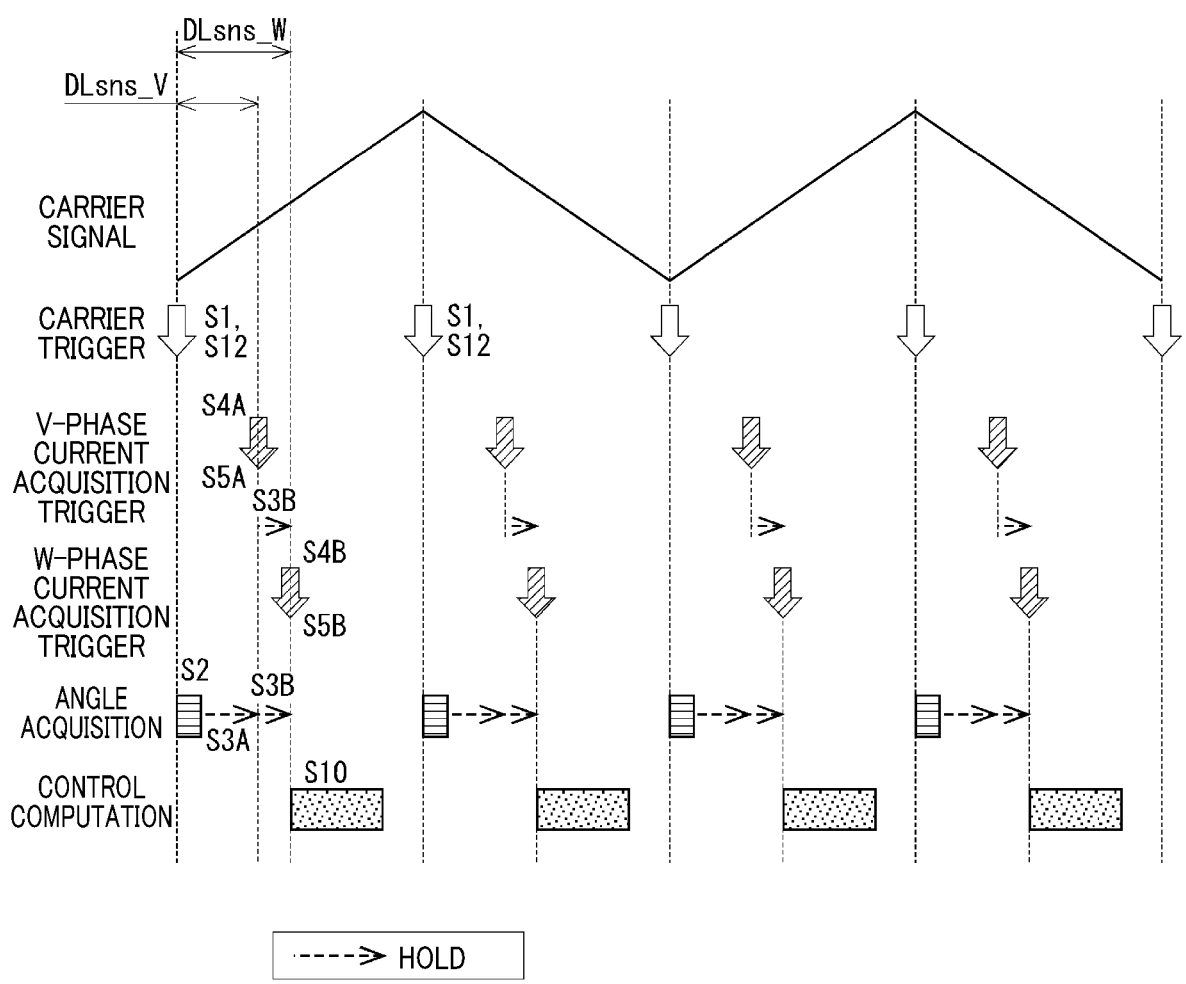
FIG. 16 is a time chart of an assumed average acquisition process according to a fourth embodiment.
Figure 17:
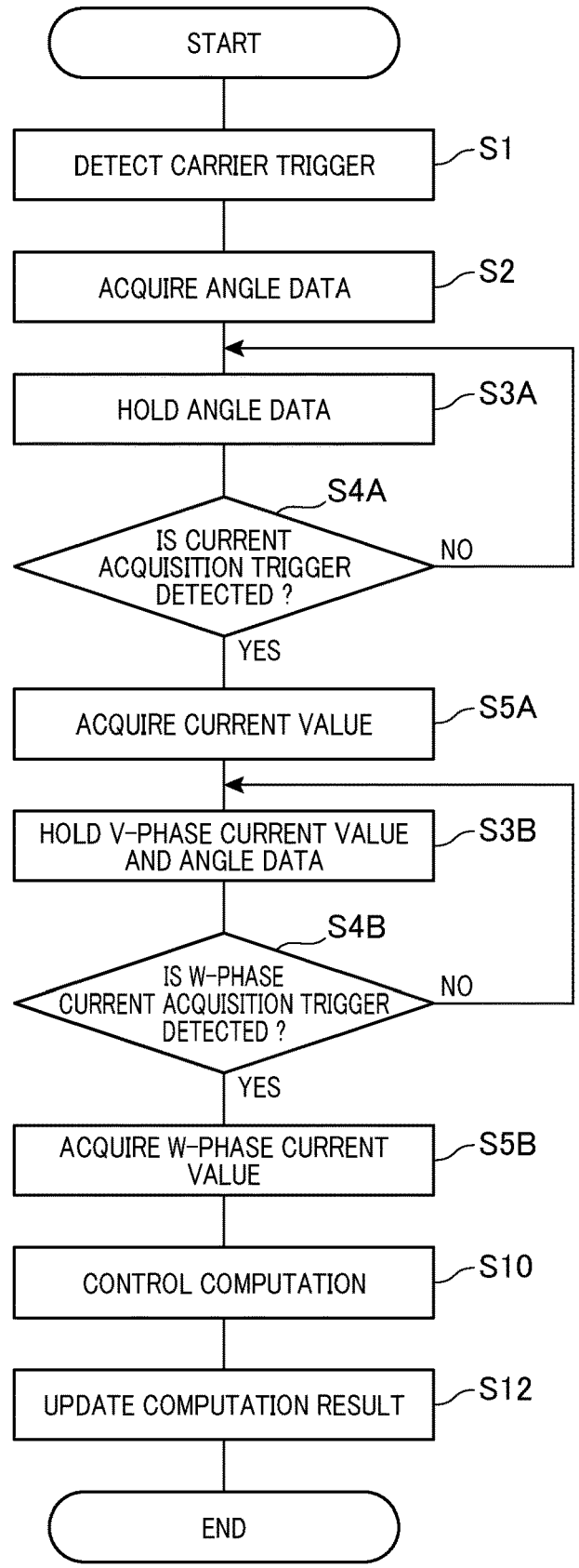
FIG. 17 is a flow chart of the assumed average acquisition process according to the fourth embodiment.

In the examples illustrated in FIGS. 16 and 17, a detection delay time DLsns_V of the V-phase current sensor 87 is shorter than a detection delay time DLsns_W of the W-phase current sensor 88. In other words, after a timing of a peak or valley of a carrier, a current acquisition trigger generation unit 52 first generates a V-phase current acquisition trigger and then generates a W-phase current acquisition trigger.

Referring to FIG. 17, the steps of current value acquisition from the current sensors 87 and 88 and holding the data are sequentially repeated. Specifically, S3A and S3B, S4A and S4B, S5A and S5B are executed as each pair of steps. In S1, S2, and S3A, as in the first embodiment, an average acquisition unit 50 simultaneously performs the acquisition of the angle and the detection of the carrier trigger, and holds the angle data. The holding of the angle data in S3A is continued until it is determined that the V-phase current acquisition trigger has been detected in S4A. When the V-phase current acquisition trigger has been detected and a YES determination is made in S4A, the average acquisition unit 50 acquires the V-phase current value from the V-phase current sensor 87 in S5A.

After S5A, the V-phase current value is held and the angle data is continuously held in S3B. The holding of the V-phase current value and the angle data in S3B is continued until it is determined in S4B that the W-phase current acquisition trigger has been detected. When the W-phase current acquisition trigger has been detected and a YES determination is made in S4B, the average acquisition unit 50 acquires the W-phase current value from the W-phase current sensor 88 in S5B.

Accordingly, the average acquisition unit 50 acquires the current values of two phases detected by the two current sensors 87 and 88 and the corresponding angle, and outputs the same to a feedback control computation unit 40. The feedback control computation unit 40 performs control computations using the V- and W-phase current values and the angle output from the average acquisition unit 50 in S10, and updates the computation results in S12.

In the configuration of a control device to detect the currents of three phases from three current sensors, the steps of current acquisition and data holding are repeated three times. In the fourth embodiments, the detection delay time DLsns is set for each of the plurality of current sensors 87 and 88. Accordingly, even when the plurality of current sensors varying in characteristics, the value of the detection current from each of the current sensors can be accurately acquired as an average corresponding to the center value of the current ripple.

After the average acquisition unit 50 acquires the plurality of current values detected by all the current sensors 87 and 88 to which the detection delay times are set and the corresponding angle, the feedback control computation unit 40 starts control computations using these current values and angle. Using the data obtained at the same timing as a set makes it possible to improve the accuracy of the control computations.

Fifth Embodiment

The fifth embodiment will be described with reference to FIGS. 18 to 20. Unlike in the first to fourth embodiments, in the fifth embodiment, an average acquisition unit 50 calculates an average of current values sampled plural times during a continuous acquisition period preset within a carrier cycle. A current acquisition trigger generation unit 52 in the fifth embodiment does not generate a current acquisition trigger once in each computation cycle but generates a start trigger and an end trigger for the continuous acquisition period.

Figure 18:
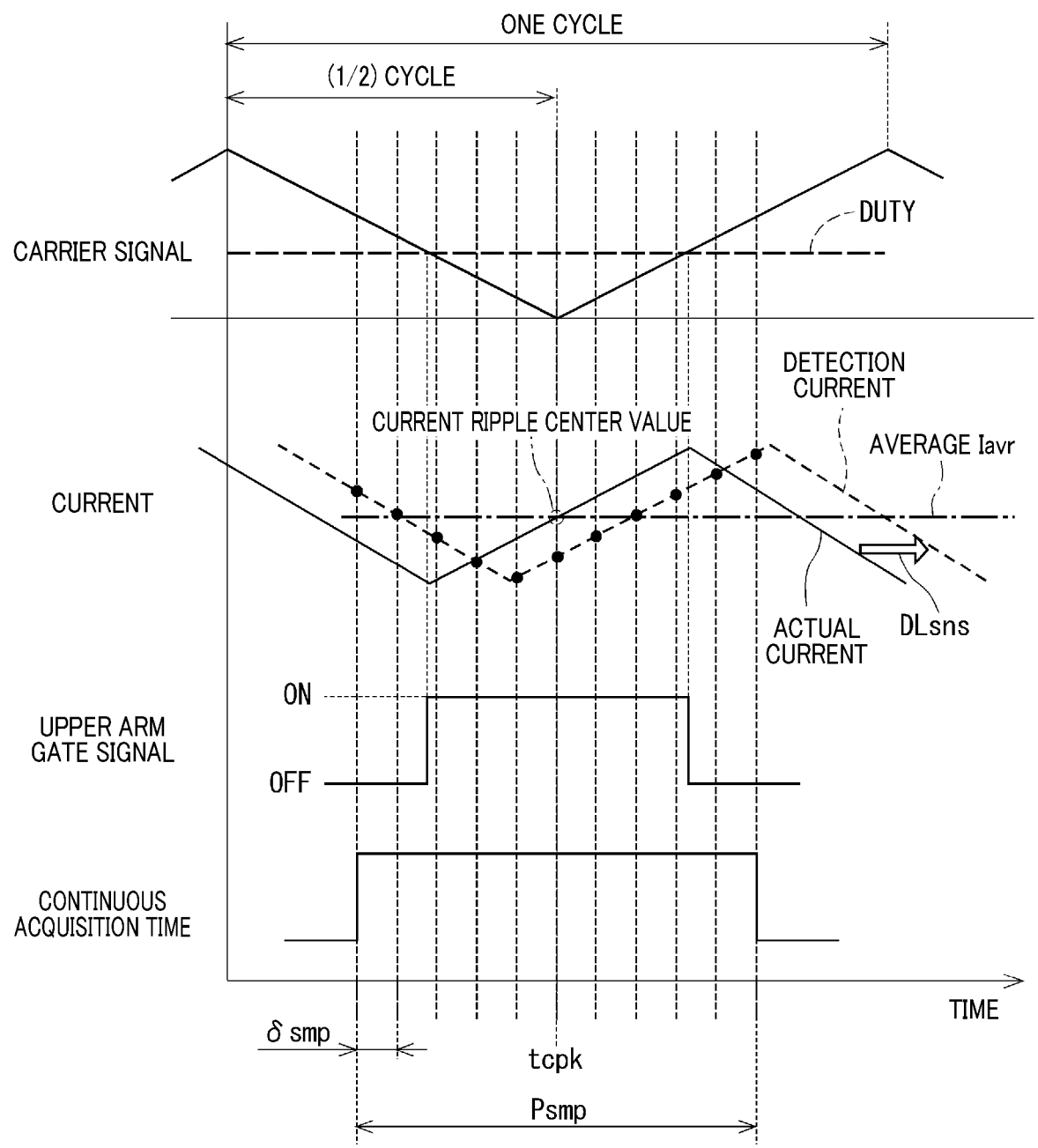
FIG. 18 is a conceptual diagram of an average calculation process according to a fifth embodiment.
Figure 19:
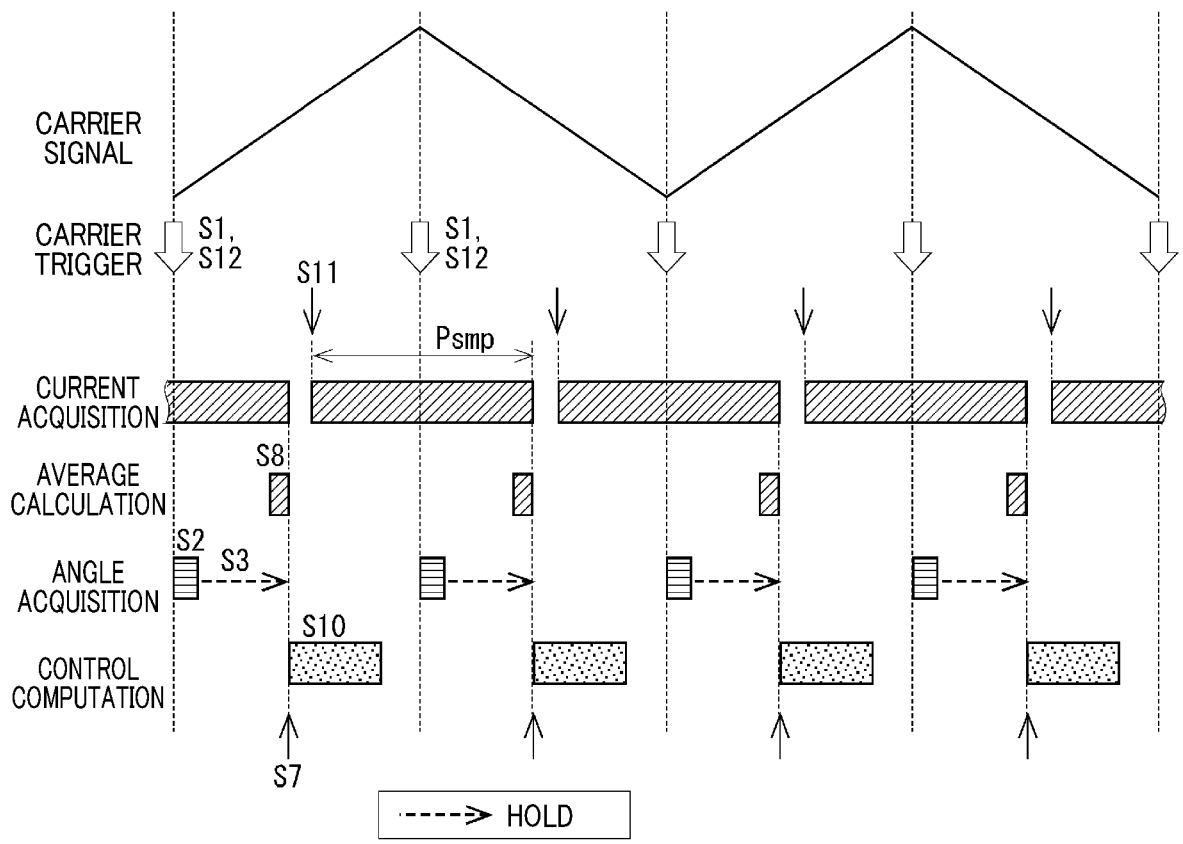
FIG. 19 is a time chart of the average calculation process according to the fifth embodiment.

In the example illustrated in FIG. 18, a continuous acquisition period Psmp is set to a length within a carrier half cycle straddling a timing of a valley of a carrier. The detection current is sampled plural times at predetermined intervals δsmp within the continuous acquisition period Psmp. The average acquisition unit 50 calculates an average Iavr of the current values sampled plural times within the continuous acquisition period Psmp. Even if the detection current lags behind the actual current, the average of the detection currents within the continuous acquisition period Psmp theoretically coincides with the average of the actual currents, that is, the center value of the current ripple. Accordingly, in the fifth embodiment, the average of the current values sampled plural times is calculated within the continuous acquisition period and is used for feedback control computation.

Subsequently, the time chart illustrated in FIG. 19 and the flow chart illustrated in FIG. 20 will be referred to. Referring to FIG. 19, the current value acquisition is performed over the continuous acquisition period Psmp. Referring to FIG. 20, S7, S8, and S11 are steps specific to the fifth embodiment. In S1, S2, and S3, as in the first embodiment, the average acquisition unit 50 simultaneously performs the detection of a carrier trigger and the acquisition of an angle, and then holds the angle data. The holding of the angle data in S3 is continued until it is determined in S7 that a current acquisition end trigger indicating the end of the continuous acquisition period Psmp has been detected.

When the current acquisition end trigger has been detected and a YES determination is made in S7, the process proceeds to S8.

In S8, the average acquisition unit 50 calculates an average Iavr of current values sampled plural times in the continuous acquisition period Psmp, and outputs the same to a feedback control computation unit 40. The feedback control computation unit 40 performs control computations using the average Iavr of the current values and the angle output from the average acquisition unit 50 in S10, and updates the computation results in S12. Along with the execution of S10, in S11, a current acquisition start trigger indicating the start of the next continuous acquisition period Psmp is detected.

In the fifth embodiment, unlike in the first to fourth embodiments in which the current acquisition timing is delayed, the average Iavr of the current values sampled plural times within the continuous acquisition period Psmp is calculated. Accordingly, the MG control device in the fifth embodiment can calculate the average of the current values in the carrier half cycle without influence of variations in the detection delay time DLsns due to the temperature characteristics, time degradation of the components and the like.

Other Embodiments (a) In the foregoing embodiments, the feedback control computation is executed in the carrier (½) cycle based on the current values and angle acquired at each timing of a peak and valley of the carrier. The time of the feedback control computation is shorter than the carrier (½) cycle. However, the computation cycle of the feedback control computation may be set to a carrier (N/2) cycle (N is a natural number) such as one carrier cycle, 1.5 carrier cycles, or two cycles. For example, when the carrier frequency synchronizes with the number of rotations and the amount of the control computation is large, it may be assumed that the computation cycle is to be set to longer than the carrier (½) cycle in a high-rotation region. In addition, the computation cycle may be set to be longer when the responsibility is to be lowered by design.

(b) The triangular wave carrier may be asymmetrical such that the period of a peak to a valley and the period of a valley to a peak are different. In that case, the term "carrier half cycle" does not mean strictly a (½) cycle but is merely interpreted as "one-way period" of the carrier.

(c) In the time charts of the foregoing embodiments, the gate signal of the upper arm element is ON in periods in which the DUTY defined as the ON time ratio of the upper arm element exceeds the carrier. However, the DUTY may be defined for the lower arm element or may be defined as a gate signal. In that case, the chart may flip vertically.

(d) The number of phases of an alternating-current electric motor driven in a system to which the present disclosure is applied is not limited to three but may be any other number. In addition, the alternating-current electric motor is not limited to a permanent-magnet synchronous motor but may be an induction electric motor or any other synchronous motor.

(e) The control device for the alternating-current electric motor according to the present disclosure is not limited to an MG drive system for a hybrid automobile or an electric automobile but may be applied to an alternating-current electric motor drive system for any other purpose.

The present disclosure described above is not limited to the foregoing embodiments but can be carried out in various modes without deviating from the gist thereof.

The present disclosure has been described so far according to the embodiments, but it is noted that the present disclosure is not limited to the foregoing embodiments or structures. The present disclosure includes various modifications and changes within a scope of the equivalents. In addition, various combinations and modes, and other combinations and modes including only one element of the foregoing combinations and modes, less or more than the one element are included in the scope and conceptual range of the present disclosure.

What is claimed is:

1. A control device for an alternating-current electric motor, comprising:
    an inverter that converts direct-current power to alternating-current power by operations of a plurality of switching elements under PWM control, and supplies the alternating-current power to the alternating-current electric motor; and
    a processor programmed to:
        acquire a rotation angle of the alternating-current electric motor at a timing of a peak or a valley of a triangular wave carrier of the PWM control, from a rotation angle sensor that divides a mechanical angle by a number of pole pairs of the alternating-current electric motor;
        use a current value acquired from a current sensor detecting a current flowing to the alternating-current electric motor and the rotation angle of the alternating-current electric motor to perform a control computation in a (N/2) cycle (N is a natural number) of the carrier;
        at the acquisition of the current value detected by the current sensor, acquire an average of the current value in a carrier half cycle as a period between a peak and a valley of the carrier, or acquire a current value regarded as an average of the current value at an acquirable timing; and when a detection delay time is defined as a time during which a current signal flowing to the alternating-current electric motor passes through the current sensor and a reception circuit of the control device and is recognized as a value usable for the control computation, acquire the current value detected by the current sensor at a timing delayed by the detection delay time from a timing of a peak or valley of the carrier.

2. The control device for the alternating-current electric motor according to claim 1, wherein the processor is programmed to acquire the rotation angle of the alternating-current electric motor simultaneously with the corresponding current value at the timing delayed by the detection delay time.

3. The control device for the alternating-current electric motor according to claim 2, wherein the processor is programmed to perform the control computation using a corrected rotation angle obtained by subtracting a correction value corresponding to an amount of a change in rotation angle at the detection delay time from the acquired rotation angle of the alternating-current electric motor.

4. The control device for the alternating-current electric motor according to claim 1, wherein the processor is programmed to, after the current value and the rotation angle of the alternating-current electric motor corresponding to each other are acquired, start the control computation using the current value and the rotation angle.

5. The control device for the alternating-current electric motor according to claim 1, wherein the detection delay time is set for each of a plurality of the current sensors.

6. The control device for the alternating-current electric motor according to claim 5, wherein the processor is programmed to, after acquiring a plurality of current values detected by all the current sensors to each of which the detection delay time is set and a corresponding rotation angle of the alternating-current electric motor, start a control computation using the current values and the rotation angle.

7. The control device for the alternating-current electric motor according to claim 1, wherein processor is programmed to calculate an average of current values sampled plural times in a continuous acquisition period set to a length within the carrier half cycle.

8. A control device for an alternating-current electric motor, comprising:

an inverter that converts direct-current power to alternating-current power by operations of a plurality of switching elements under PWM control, and supplies the alternating-current power to the alternating-current electric motor; and a processor programmed to:

use a current value acquired from a current sensor detecting a current flowing to the alternating-current electric motor and a rotation angle of the alternating-current electric motor to perform a control computation in a (N/2) cycle (N is a natural number) of a triangular wave carrier of the PWM control;

at the acquisition of the current value detected by the current sensor, acquire an average of the current value in a carrier half cycle as a period between a peak and a valley of the carrier, or acquire a current value regarded as an average of the current value at an acquirable timing; and when a detection delay time is defined as a time during which an electric signal flowing to the alternating-current electric motor passes through the current sensor and a reception circuit of the control device and is recognized as a value usable for the control computation, and when an element action delay time is defined as an average delay time of ON action and OFF action with respect to a gate signal commanded to the switching element, acquire the current value detected by the current sensor at a timing delayed by an added delay time obtained by adding the element action delay time to the detection delay time from a timing of a peak or valley of the carrier.

* * * * *